US010175282B2

(12) United States Patent
Chen et al.

(10) Patent No.: US 10,175,282 B2
(45) Date of Patent: Jan. 8, 2019

(54) POWER DISTRIBUTION UNIT AND ALARM METHOD APPLIED IN THE SAME

(71) Applicant: International Business Machines Corporation, Armonk, NY (US)

(72) Inventors: Wei T. Chen, Taipei (TW); Yulianti Darmanto, Taipei (TW); Cheng-Hao Lin, Taipei (TW); Y. K. Liu, Taipei (TW); Claire H W Tsai, Taipei (TW)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/581,024

(22) Filed: Apr. 28, 2017

(65) Prior Publication Data

US 2017/0229001 A1    Aug. 10, 2017

Related U.S. Application Data

(63) Continuation of application No. 14/929,513, filed on Nov. 2, 2015, now Pat. No. 9,714,972, which is a
(Continued)

(30) Foreign Application Priority Data

Jun. 24, 2014   (TW) .............................. 103122054 A

(51) Int. Cl.
*G08B 21/00* (2006.01)
*G01R 31/02* (2006.01)
(Continued)

(52) U.S. Cl.
CPC ......... *G01R 31/024* (2013.01); *G01R 31/025* (2013.01); *G01R 31/045* (2013.01); *G08B 21/185* (2013.01)

(58) Field of Classification Search
CPC .... G08B 21/185; G08B 13/1409; H02H 3/04; G01R 19/14
(Continued)

(56) References Cited

U.S. PATENT DOCUMENTS 3,644,912 A * 2/1972 Allen, Jr. ............... G08B 13/22
340/538
3,728,581 A * 4/1973 Adamo ............. H01R 13/7135
340/650
(Continued)

FOREIGN PATENT DOCUMENTS

CN        101814223 A    8/2010
CN        202676825 U    1/2013
(Continued)

OTHER PUBLICATIONS

List of IBM Patents or Applications Treated as Related, Apr. 2017.

*Primary Examiner* — Hoi Lau
(74) *Attorney, Agent, or Firm* — Lieberman & Brandsdorfer, LLC

(57) ABSTRACT

A power distribution unit including a base, at least one socket, and at least one detecting unit is provided. The socket is disposed at the base and has a power end and a ground end. The detecting unit is disposed at the base and comprises at least two switches in communication with an AND gate. Communication between a plug and the socket is detected utilizing the AND gate. A voltage signal is output responsive to the detected communication. More specifically, a first voltage signal is output responsive to detection of receipt of both the power end and the ground end by the socket and/or receipt of the ground end by the socket and absence of the power end. A second voltage signal is output responsive to receipt of the power end by the socket and absence of the ground end.

17 Claims, 3 Drawing Sheets

Related U.S. Application Data continuation of application No. 14/746,983, filed on Jun. 23, 2015, now Pat. No. 9,625,511.

(51) Int. Cl.
  *G08B 21/18* (2006.01)
  *G01R 31/04* (2006.01)

(58) Field of Classification Search
  USPC ......... 340/649, 679, 12.32, 687; 361/50, 42, 361/102, 220; 324/508
  See application file for complete search history.

(56) References Cited

U.S. PATENT DOCUMENTS

| | | | |
|---|---|---|---|
| 3,924,914 A * | 12/1975 | Banner | G01R 19/14 340/641 |
| 4,059,843 A * | 11/1977 | Girismen | G08B 13/1409 307/326 |
| 4,075,617 A * | 2/1978 | Wireman | G08B 13/1409 200/51.1 |
| 4,111,516 A * | 9/1978 | Wireman | H01R 13/648 324/508 |
| 4,298,864 A * | 11/1981 | Mahnke | G01R 19/16571 340/649 |
| 4,318,578 A * | 3/1982 | Ericson | H01R 13/717 439/106 |
| 4,447,844 A * | 5/1984 | Schossow | H02H 11/001 307/326 |
| 5,099,212 A * | 3/1992 | Nagaishi | G01R 27/20 324/133 |
| 5,269,697 A * | 12/1993 | Essex | H01R 13/443 439/135 |
| 5,434,558 A * | 7/1995 | Zeder | G08B 13/1409 200/51.1 |
| 5,642,248 A * | 6/1997 | Campolo | H01R 13/7135 361/115 |
| 5,774,315 A * | 6/1998 | Mussenden | H02H 9/004 307/86 |
| 5,892,974 A * | 4/1999 | Koizumi | A63F 13/06 710/16 |
| 6,462,555 B1 * | 10/2002 | Schaefer | G01R 31/024 324/508 |
| 6,987,659 B1 * | 1/2006 | Epstein | A61N 1/14 361/212 |
| 7,193,837 B1 * | 3/2007 | Epstein | H01R 4/66 361/220 |
| 7,651,347 B2 * | 1/2010 | Germain | H01R 13/4534 439/137 |
| 8,125,345 B2 | 2/2012 | Curt et al. | |
| 8,461,492 B1 * | 6/2013 | Briones, Jr. | H05B 1/0266 219/491 |
| 8,742,943 B2 | 6/2014 | Garb | |
| 8,957,551 B1 * | 2/2015 | Alberth, Jr. | G05B 15/02 307/116 |
| 9,007,186 B1 * | 4/2015 | Krummey | G06Q 50/06 340/12.32 |
| 9,252,669 B2 * | 2/2016 | Nate | H02M 3/335 |
| 9,625,511 B2 * | 4/2017 | Chen | G01R 31/024 |
| 9,714,972 B2 * | 7/2017 | Chen | G01R 31/024 |
| 2002/0057089 A1 * | 5/2002 | Brown | G01R 31/041 324/508 |
| 2006/0152379 A1 * | 7/2006 | Lewis | H02H 3/04 340/679 |
| 2007/0086126 A1 * | 4/2007 | Baxter | H02H 11/005 361/42 |
| 2007/0111569 A1 * | 5/2007 | Germain | H01R 13/4534 439/137 |
| 2010/0033908 A1 | 2/2010 | Fernald, Jr. | |
| 2010/0317222 A1 * | 12/2010 | Tom | H01R 13/652 439/490 |
| 2011/0187552 A1 * | 8/2011 | Garb | H02H 9/042 340/815.45 |
| 2012/0170292 A1 * | 7/2012 | Bhosale | H01R 13/6658 362/415 |
| 2012/0320485 A1 * | 12/2012 | Huang | H02H 1/04 361/114 |
| 2013/0027983 A1 * | 1/2013 | Nate | H02M 3/335 363/21.01 |
| 2014/0375328 A1 * | 12/2014 | Lenzie | G01R 31/041 324/508 |
| 2015/0077243 A1 * | 3/2015 | Hooper | H02H 3/16 340/532 |
| 2015/0371525 A1 * | 12/2015 | Chen | G08B 21/185 340/649 |
| 2016/0054367 A1 * | 2/2016 | Chen | G08B 21/185 340/649 |
| 2017/0229001 A1 * | 8/2017 | Chen | G08B 21/185 |
| 2017/0307673 A1 * | 10/2017 | Chen | G01R 31/045 |

FOREIGN PATENT DOCUMENTS

| | | |
|---|---|---|
| EP | 0976234 A2 | 2/2000 |
| EP | 1000500 A2 | 5/2000 |
| EP | 1226495 A2 | 7/2002 |
| TW | 527756 | 4/2003 |
| TW | 201123650 | 7/2011 |
| TW | 201135245 A | 10/2011 |
| TW | 201136070 | 10/2011 |
| TW | 201222484 | 6/2012 |

\* cited by examiner

POWER DISTRIBUTION UNIT AND ALARM METHOD APPLIED IN THE SAME

CROSS-REFERENCE TO RELATED APPLICATION(S)

This application is a continuation patent application of U.S. patent application Ser. No. 14/929,513, Filed Nov. 2, 2015, titled "Power Distribution Unit and Alarm Method Applied in the Same", which is a continuation patent application of U.S. Pat. No. 9,625,511, filed Jun. 23, 2015, titled "Power Distribution Unit And Alarm Method Applied In The Same", both of which are hereby incorporated by reference, and which claims the benefit of priority from Taiwan Patent Application 103122054 filed on Jun. 24, 2014, which is incorporated herein by reference and assigned to the assignee herein.

BACKGROUND

The present embodiments relates to a power distribution unit and in particular, to detection of communication between a plug and a socket.

DESCRIPTION OF THE PRIOR ART

For the existing power distribution unit (also called PDU), please refer to IBM's power distribution unit products, such as PDU+.

In general, a power distribution unit is provided with an external cable to be electrically connected to a fixed power, e.g. a voltage source of 110 V or 220 V. In addition, the power distribution unit is usually provided with a plurality of sockets such that plugs of various electronic devices can be inserted in the sockets and the required electricity power can be provided to each of the electronic devices.

However, in some cases, the plug of an electronic device is not provided with a ground end, or the ground end is often deliberately removed by a user. Therefore, if a plug of an electronic device which does not have a ground end is used to be inserted into a socket of a power distribution unit, when encountering a high voltage injection due to lightning, voltage surges or unintentional voltage contact, the electronic device cannot be protected by means of the overvoltage protection such that sparks can easily occur as the plug is inserted in or removed from the socket. Furthermore, in case of voltage instability, the electronic device is likely to be damaged due to voltage surges, and results in an electric shock to a user due to electrical leakage.

SUMMARY

The present embodiments include a system, a computer program product and a method for detecting communication between a plug and a socket.

In one aspect, a system for applying a voltage signal responsive to detected communication between a plug and a socket is provided. The socket is disposed at the base and configured to receive the plug which has a power end and a ground end. A detecting unit is disposed at the base and is in communication with the socket. The detecting unit includes a first switch, a second switch, and an AND gate. The first switch is configured to detect receipt of the power end of the plug by the socket. Similarly, the second switch is configured to detect receipt of the ground end of the plug by the socket. The AND gate has a first input in communication with the first switch and a second input in communication with the second switch. The AND gate is configured to output a first voltage signal responsive to receipt of both the power end and the ground end and/or receipt of the ground end and absence of the power end, and output a second voltage signal responsive to receipt of the power end and absence of the ground end.

In another aspect, a computer program product comprising a computer readable storage device having program code embodied therewith for employing a voltage signal responsive to detected communication between a plug and a socket is provided. More specifically, program code configures a socket disposed at a base to receive a plug which has a power end and a ground end. Program code configures a detecting unit disposed at the base in communication with the socket. More specifically, a first switch is configured to detect receipt of the power end of the plug by the socket and a second switch is configured to detect receipt of the ground end of the plug by the socket. An AND gate is positioned with a first input in communication with the first switch and a second input in communication with the second switch. Program code detects communication between the first plug and the first socket utilizing the AND gate. Program code outputs a voltage signal responsive to the detection, including outputting a first voltage signal responsive to detection of both the power end and the ground end and/or receipt of the ground end and absence of the power end, and a second voltage signal responsive to receipt of the power end and absence of the ground end.

In another aspect, a method is provided for applying a voltage signal responsive to detected communication between a plug and a socket. More specifically, a socket disposed at a base is configured to receive a plug which has a power end and a ground end. A detecting unit disposed at the base is configured in communication with the socket. More specifically, a first switch is configured to detect receipt of the power end of the plug by the socket and a second switch is configured to detect receipt of the ground end of the plug by the socket. An AND gate is configured with a first input in communication with the first switch and a second input in communication with the second switch. Communication between the plug and the socket is detected utilizing the AND gate. A voltage signal is output responsive to the detection including outputting a first voltage signal responsive to detection of both the power end and the ground end and/or receipt of the ground end and absence of the power end, and a second voltage signal is output responsive to receipt of the power end and absence of the ground end.

These and other features and advantages will become apparent from the following detailed description of the presently preferred embodiment(s), taken in conjunction with the accompanying drawings.

BRIEF DESCRIPTION OF THE DRAWINGS

In order that the advantages of the embodiments will be readily understood, a more particular description of the embodiments briefly described above will be rendered by reference to specific embodiments that are illustrated in the appended drawings. Understanding that these drawings depict only typical embodiments and are not therefore to be considered to be limiting of its scope, the embodiments will be described and explained with additional specificity and detail through the use of the accompanying drawings.

DETAILED DESCRIPTION

Hereinafter, the present embodiments will be described in more detail with reference to the accompanying drawings. Nevertheless, it should be understood that the present embodiments could be modified by those skilled in the art in accordance with the following description to achieve the excellent results of the present embodiments. Therefore, the following description shall be considered as a pervasive and explanatory disclosure related to the present embodiments for those skilled in the art, not intended to limit the claims of the present embodiments.

Citation of "a specific embodiment" or a similar expression in the specification means that specific features, structures, or characteristics described in the specific embodiment are included in at least one specific embodiment of the present embodiments. Hence, the wording "in a specific embodiment" or a similar expression in this specification does not necessarily refer to the same specific embodiment.

Reference throughout this specification to features, advantages, or similar language does not imply that all of the features and advantages that may be realized with the present embodiments should be or are in any single embodiment of the embodiments. Rather, language referring to the features and advantages is understood to mean that a specific feature, advantage, or characteristic described in connection with an embodiment is included in at least one embodiment of the present embodiments. Thus, discussion of the features and advantages, and similar language, throughout this specification may, but do not necessarily, refer to the same embodiment.

Furthermore, the described features, advantages, and characteristics of the embodiments may be combined in any suitable manner in one or more embodiments. One skilled in the relevant art will recognize that the embodiments may be practiced without one or more of the specific features or advantages of a particular embodiment. In other instances, additional features and advantages may be recognized in certain embodiments that may not be present in all embodiments.

The following description and the appended claims further illustrate the features and advantages of the present embodiments.

[Structure of the Power Distribution Unit]

Figure 1:
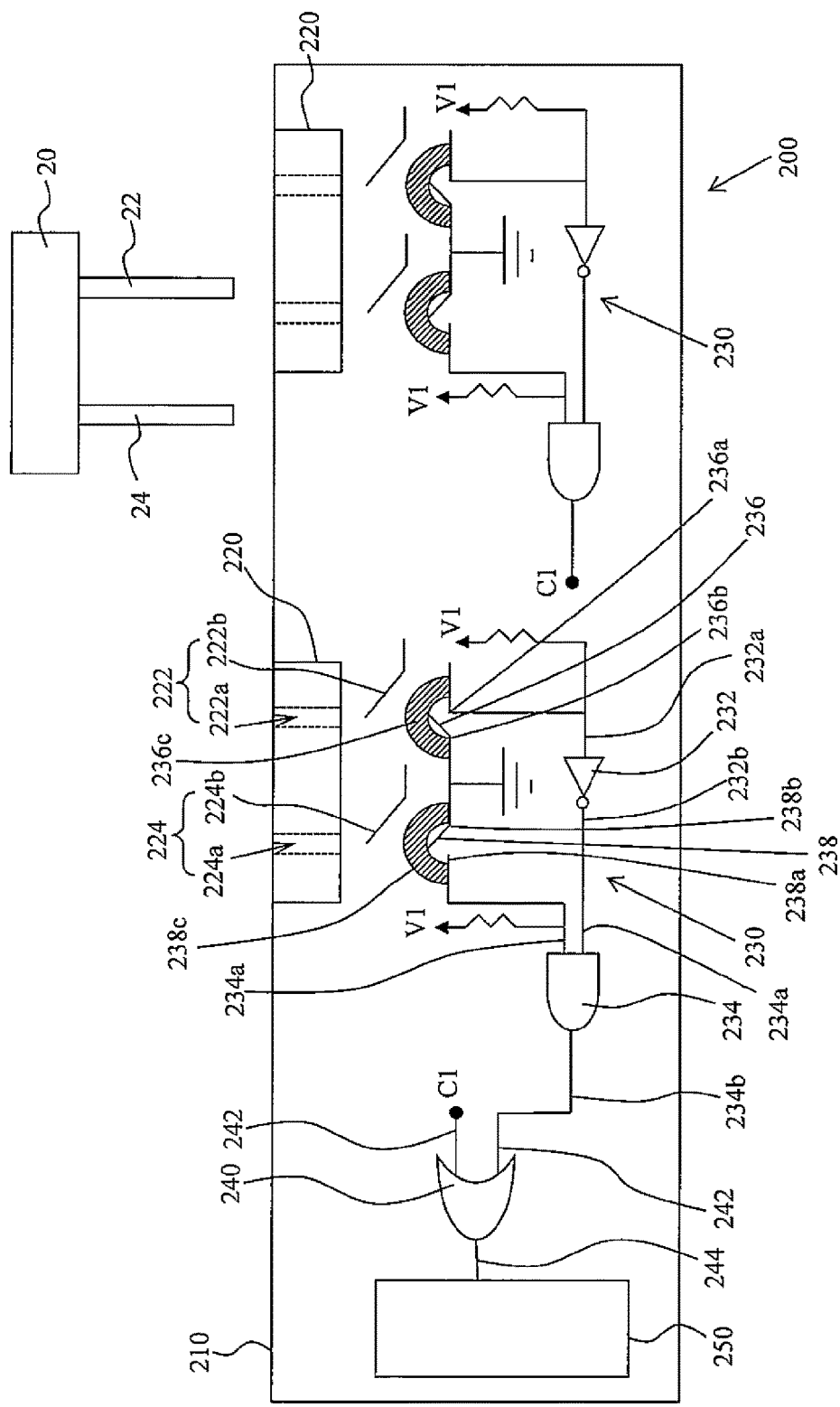
FIG. 1 depicts a schematic diagram of a power distribution unit according to an embodiment.

Referring to FIG. 1, a schematic diagram of a power distribution unit (200) is provided according to an embodiment. The power distribution unit (200) includes a base (210), at least a socket (220) (a plurality of sockets (220) are shown in FIG. 1), at least one detecting unit (230) (a plurality of detecting units (230) are shown in FIG. 1), an OR gate (240), a management unit (250) and an external cable (not shown). Each of the sockets (220) is disposed at the base (210) and includes at least one power end (222) (two power ends (222) are usually included but only one is schematically illustrated in FIG. 1) and a ground end (224).

In an embodiment, the power end (222) of each of the sockets (220) may include a power jack (222a) and a power elastic piece (222b) located near the power jack (222a). The ground end (224) of each of the sockets (220) may include a ground jack (224a) and a ground elastic piece (224b) located near the ground jack (224a). In addition, a plug (20) of an external electronic device (e.g. a server such as IBM's System X, Blade Center or eServer, but not shown) is adapted to be disposed at one of the sockets (220). The plug (20) of the external electronic device may include at least one power end (22) (two power ends (22) are usually included but only one is schematically illustrated in FIG. 1) and a ground end (24). In an embodiment, the power end (22) and the ground end (24) of the plug (20) may be pins, respectively.

The detecting units (230) are disposed at the base (210) and respectively correspond to the sockets (220). In the present embodiment, each of the detecting units (230) includes an inverter (232), an AND gate (234), a first switch (236) and a second switch (238). In each of the detecting units (230), the inverter (232) includes an input end (232a) and an output end (232b). The AND gate (234) includes two input ends (234a) and an output end (234b). The first switch (236) includes a first end (236a), a second end (236b) and an insulating elastomer (236c), and the second switch (238) includes a first end (238a), a second end (238b) and an insulating elastomer (238c). When the power distribution unit (200) is in the initial state, that is, all sockets (220) are not inserted with any plugs, both the first switch (236) and the second switch (238) are open.

In each of the detecting units (230), one of the input ends (234a) of the AND gate (234) is electrically connected to the output end (232b) of the inverter (232), and the first end (236a) of the first switch (236) is electrically connected to the input end (232a) of the inverter (232). In each of the detecting units (230), the first end (236a) of the first switch (236) and the input end (232a) of the inverter (232) are together electrically connected to a preset power V1, and the second end (236b) of the first switch (236) is grounded. The first switch (236) of each of the detecting units (230) corresponds to the power end (222) of one of the sockets (220).

In each of the detecting units (230), the first end (238a) of the second switch (238) is electrically connected to another of the input ends (234a) of the AND gate (234). In each of the detecting units (230), the first end (238a) of the second switch (238) and the other input end (234a) of the AND gate (234) are together electrically connected to a preset power V1, and the second end (238b) of the second switch (238) is grounded. The second switch (238) of each of the detecting units (230) corresponds to the ground end (224) of one of the sockets (220).

The output end (234b) of the AND gate (234) of each of the detecting units (230) is electrically connected to one of a plurality of input ends (242) of the OR gate (240). An output end (244) of the OR gate (240) is electrically connected to the management unit (250). The management unit (250) is used for determining whether to perform a predetermined operation according to a signal transmitted from the output end (244) of the OR gate (240). The predetermined operation is, for example, to generate a visual alarm message (e.g. to turn on an alarm light) or an auditory alarm sound (e.g. to issue an alarm noise). The details will be described hereinafter.

In other embodiments, the number of the sockets (220) and that of the detecting units (230) may vary. When the number of the socket (220) and that of the detecting unit (230) is one, respectively, the OR gate (240) can be omitted and the output end (234b) of the AND gate (234) of the detecting unit (230) can be electrically connected to the management unit (250) directly.

[Operation of the Power Distribution Unit]

The operation of the power distribution unit (200) will be described hereinafter. Please refer to FIG. 1. When the power distribution unit (200) is in the initial state (i.e. no plug is inserted into any of the sockets (220)), the output ends (234b) of the AND gates (234) of all the detecting units (230) respectively output first signals (e.g. a low voltage signal), and the management unit (250) does not generate a visual alarm message (or an auditory alarm sound) according to a signal transmitted from the output end (244) of the OR gate (240). In one embodiment, the aspect of not generating an alarm message is also referred to as deterring the generation of the alarm message.

Figure 2:
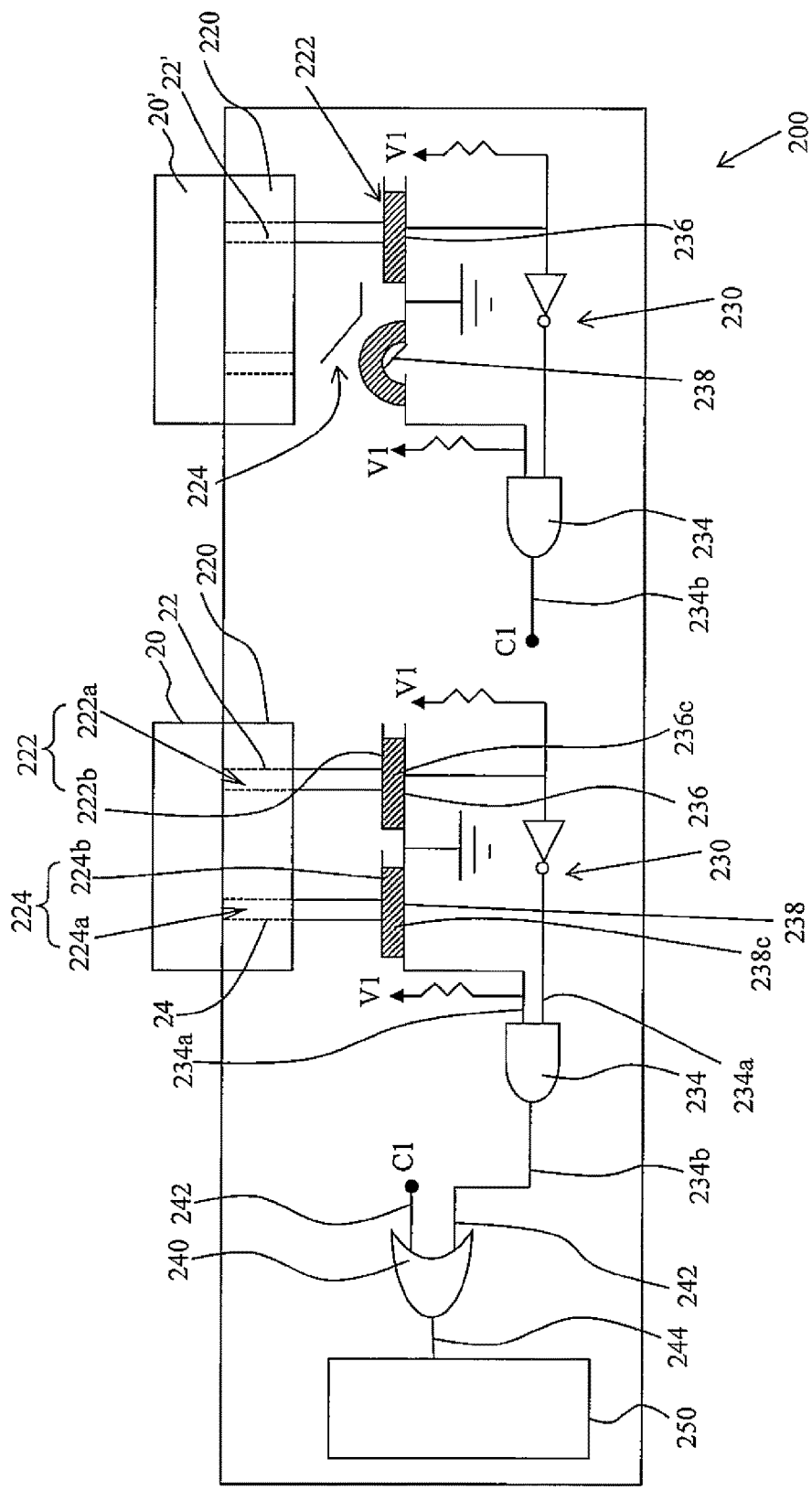
FIG. 2 depicts a schematic diagram showing the sockets of the power distribution unit where the plugs are inserted according to an embodiment.

Referring to FIG. 2, which is a schematic diagram showing the sockets of the power distribution unit where the plugs are inserted according to an embodiment. As shown in FIG. 2, the plugs (20) and (20') are respectively inserted into the sockets (220) of the power distribution unit (200). The power end (22) and the ground end (24) of the plug (20) are respectively electrically connected to the power end (222) and the ground end (224) of the corresponding socket (220) such that both the first switch (236) and second switch (238) of the corresponding detecting unit (230) are short. Accordingly, the output end (234b) of the AND gate (234) of the corresponding detecting unit (230) outputs a first signal (e.g. a low voltage signal).

It should be noted here that, in the present embodiment, when the power end (220 and the ground end (24) of the plug (20) are respectively inserted into the power jack (222a) and ground jack (224a) of the corresponding socket (220), the power end (22) and the ground end (24) of the plug (20) respectively press and are electrically connected to the corresponding power elastic piece (222b) and the corresponding ground elastic piece (224b). At this time, the corresponding power elastic piece (222b) and the corresponding ground elastic piece (224b) are electrically connected to a power line and a ground line of an external cable (not shown) respectively, and press the insulating elastomer (236c) of the corresponding first switch (236) and the insulating elastomer (238c) of the corresponding second switch (238), respectively such that the two ends (236a) and (236b) of the corresponding first switch (236) (see FIG. 1) are electrically conductive and the two ends (238a) and (238b) of the corresponding second switch (238) (see FIG. 1) are electrically conductive.

Referring to FIG. 2 again. The power end (22') of the plug (20') is electrically connected to the power end (222) of the corresponding socket (220) such that the corresponding first switch (236) is short. However, the plug (20') is not electrically connected to the ground end (224) of the corresponding socket (220) such that the corresponding second switch (238) is still open. Accordingly, the output end (234b) of the AND gate (234) of the corresponding detecting unit (230) outputs a second signal (that is, an alarm signal, e.g. a high voltage signal).

Based on the above mentioned, since one of the detecting units (230) corresponding to the sockets (220) outputs the alarm signal to the OR gate (240) and the output end (244) of the OR gate (240) then transmits the alarm signal to the management unit (250), the management unit (250) performs a predetermined operation in response to the alarm signal. The predetermined operation is, for example, to generate a visual alarm message (e.g. to turn on an alarm light) or an auditory alarm sound (e.g. to issue an alarm noise) to alert the user.

Based on the aforementioned, in the case that a plug is inserted into the power distribution unit (200) in the present embodiment, as long as the power end (222) of the corresponding socket (220) is electrically connected to the plug but the ground end (224) of the corresponding socket (220) is not electrically connected to the plug, the management unit (250) of the power distribution unit (200) generates a visual alarm message (e.g. turns on an alarm light) or an auditory alarm sound (e.g. issues an alarm noise) to alert the user. In addition, in the case that in the present embodiment no plug is inserted into the power distribution unit (200) or the inserted plug is electrically connected to both the power end (222) and the ground end (224) of the corresponding socket (220), the management unit (250) does not generate the aforementioned alarm message or alarm sound.

[An Alarm Method Applied in the Power Distribution Unit]

Figure 3:
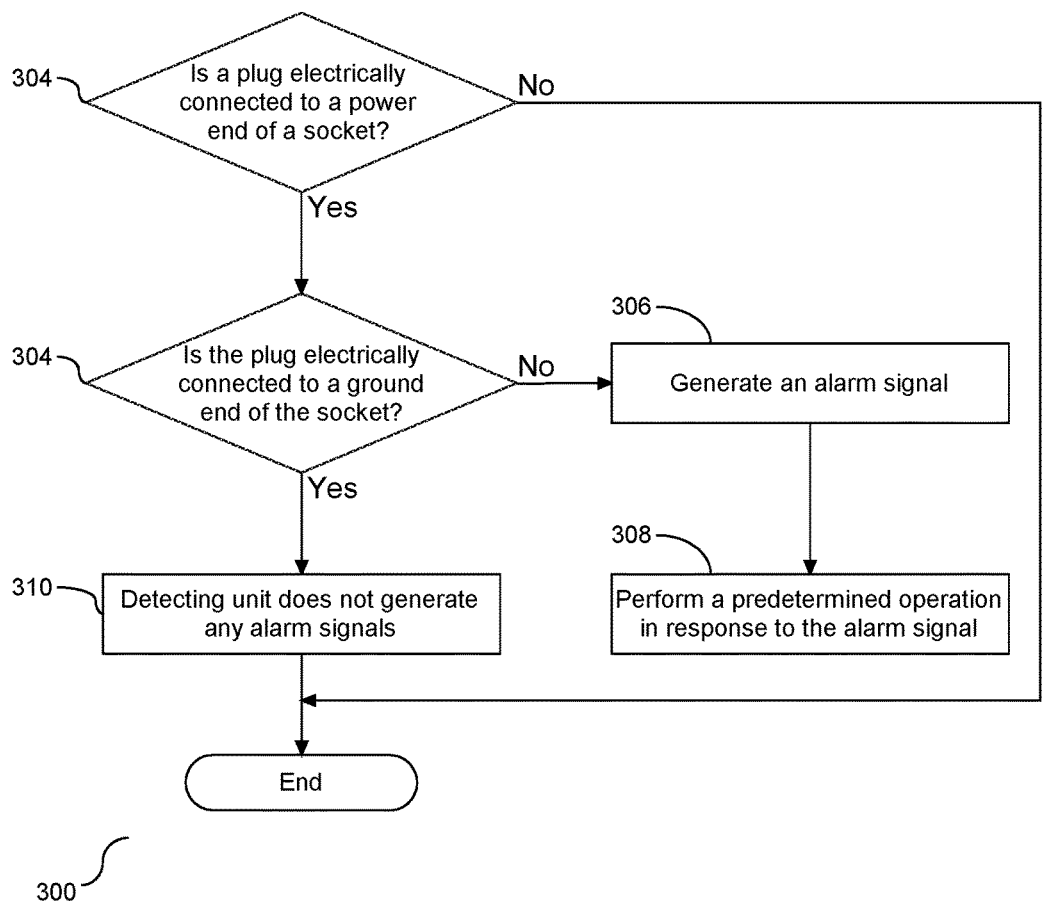
FIG. 3 depicts a flowchart illustrating the alarm method applied in the power distribution unit according to an embodiment.

An alarm method applied in the power distribution unit (200) is described hereinafter. FIG. 3 is a flowchart (300) illustrating the alarm method applied in the power distribution unit according to an embodiment. Please refer to FIG. 1 to FIG. 3. The alarm method applied in the power distribution unit according to an embodiment of the present embodiments includes the following steps. First, Step (302) is performed. The electrical connection between a plug and the power end (222) of the corresponding socket (220) of the power distribution unit (200) is determined. Then, if the plug is electrically connected to the power end (222) of the corresponding socket (220), Step (304) is performed, i.e. the electrical connection between the plug and the ground end (224) of the corresponding socket (220) is determined. Next, if the plug is not electrically connected to the ground end (224) of the corresponding socket (220), Step (306) is performed, i.e. the corresponding detecting unit (230) generates an alarm signal, followed by Step (308) wherein the management unit (250) performs a predetermined operation in response to the alarm signal. The predetermined operation is, for example, to generate a visual alarm signal (e.g. to turn on an alarm light) or an auditory alarm sound (e.g. to issue an alarm noise) to alert the user. If at step (304), it is determined that the plug is electrically connected to a ground end of the socket, the detecting unit does not generate any alarming signal(s) (310).

In the present embodiment, if the plug is not electrically connected to the power end (222) of any socket (220) (e.g. the power distribution unit 200 is in the initial state as shown in FIG. 1), all the detecting units (230) do not generate any alarm signals. If the plug is electrically connected to the ground end (224) of the corresponding socket (220), the corresponding detecting unit (230) does not generate an alarm signal.

The present embodiment(s) has one of the following advantages or another advantage. In the case that a plug is inserted into the power distribution unit in an embodiment of the present embodiments, as long as the power end of the corresponding socket is electrically connected to the plug but the ground end of the corresponding socket is not electrically connected to the plug, the corresponding detecting unit outputs an alarm signal. In response to the alarm signal, the management unit of the power distribution unit generates a visual alarm message or an auditory alarm sound to alert the user.

In addition, in the case that in an embodiment no plug is inserted into the power distribution unit or the inserted plug is electrically connected to both the power end and the ground end of the corresponding socket, all the detecting units do not output any alarm signals. The management unit does not generate any alarm message or alarm sound.

As will be appreciated by one skilled in the art, the present embodiments may be embodied as a computer system, a method or a computer program product. Accordingly, the present embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present embodiments may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server.

The present embodiments are described below with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The foregoing detailed description of the embodiments is used to further clearly describe the features and spirit of the present embodiments. The foregoing description for each embodiment is not intended to limit the scope of the present embodiments. All kinds of modifications made to the foregoing embodiments and equivalent arrangements should fall within the protected scope of the present embodiments. Hence, the scope of the present embodiments should be explained most widely according to the claims described thereafter in connection with the detailed description, and should cover all the possibly equivalent variations and equivalent arrangements.

What is claimed is:

1. A system, comprising:
   a first socket configured to receive a first plug having a first power end and a first ground end, the first socket disposed at a base; and
   a first detecting unit in communication with the first socket, the first detecting unit disposed at the base, the first detecting unit comprising:
      a first switch and a second switch, the first switch configured to detect receipt of the first power end by the first socket and the second switch configured to detect receipt of the first ground end by the first socket;
      a first AND gate having a first input in communication with the first switch and a second input in communication with the second switch, the first AND gate configured to output a first voltage signal responsive to one of receipt of both the first power end and the first ground end and receipt of the first ground end and absence of the first power end; and
      the first AND gate to output a second voltage signal responsive to receipt of the first power end and absence of the first ground end.

2. The system of claim 1, further comprising:
   each switch having a first switch end connected to a ground, and each switch having a second switch end connected to a preset power, the second switch end of the second switch connected to the second input of the first AND gate; and
   an inverter having a first inverter end connected to the second switch end of the first switch, the inverter having a second inverter end connected to the first input of the first AND gate.

3. The system of claim 1, further comprising:
   a first body configured to electrically communicate with the first power end, the first body in communication with the first switch and configured to electrically connect the first and second switch ends of the first switch responsive to receipt of the first power end by the first socket, wherein the first body has an elastic and electrically-conductive property.

4. The system of claim 3, further comprising:
a second body configured to electrically communicate with the first ground end, the second body in communication with the second switch and configured to electrically connect the first and second switch ends of the second switch responsive to receipt of the first ground end by the first socket, wherein the second body has an elastic and electrically-conductive property.

5. The system of claim 4, further comprising:
a first insulating elastomer in communication with the first switch and the first body, the first insulating elastomer configured to facilitate communication between the first switch and the first body.

6. The system of claim 5, further comprising:
a second insulating elastomer in communication with the second switch and the second body, the second insulating elastomer configured to facilitate communication between the second switch and the second body.

7. The system of claim 1, further comprising:
a management unit in electrical communication with a first output end of the first AND gate, the management unit to perform a predetermined operation responsive to the second voltage signal.

8. The system of claim 7, wherein the predetermined operation is selected from the group consisting of: a visual alarm and an auditory alarm.

9. The system of claim 7, further comprising:
a second socket configured to receive a second plug having a second power end and a second ground end, the second socket disposed at the base; and
a second detecting unit in communication with the second socket, the second detecting unit disposed at the base, the second detecting unit comprising:
a third switch and a fourth switch, the third switch configured to detect receipt of the second power end by the second socket and the fourth switch configured to detect receipt of the second ground end by the second socket;
a second AND gate having a third input in communication with the third switch and a fourth input in communication with the fourth switch, the second AND gate configured to output the first voltage signal responsive to one of receipt of both the second power end and the second ground end and receipt of the second ground end and absence of the second power end; and
the second AND gate to output a second voltage signal responsive to receipt of the second power end and absence of the second ground end; and
an OR gate in communication with the first output end of the first AND gate and a second output end of the second AND gate, the OR gate configured to output the second voltage to the management unit responsive to receipt of the second voltage signal from at least one of the first AND gate and the second AND gate.

10. A computer program product for employing a voltage signal responsive to detected communication between a socket and a plug, the computer program product comprising a computer readable hardware storage device having program code embodied therewith, the program code executable by a processing unit to:
configure a first socket to receive a first plug having a first power end and a first ground end, the first socket disposed at a base; and
configure a first detecting unit in communication with the first socket, the first detecting unit disposed at the base, the first detecting unit comprising:
a first switch and a second switch, the first switch configured to detect receipt of the first power end by the first socket and the second switch configured to detect receipt of the first ground end by the first socket; and
a first AND gate having a first input in communication with the first switch and a second input in communication with the second switch;
detect, utilizing the first AND gate, communication between the first plug and the first socket; and
output a voltage signal responsive to the detection including output a first voltage signal responsive to detection of one of receipt of both the first power end and the first ground end and receipt of the first ground end and absence of the first power end, and outputting a second voltage signal responsive to receipt of the first power end and absence of the first ground end.

11. The computer program product of claim 10, further comprising program code to:
configure a management unit in electrical communication with an first output end of the first AND gate; and
perform a predetermined operation responsive to receipt of the second voltage signal by the management unit.

12. The computer program product of claim 11, wherein the predetermined operation is selected from the group consisting of: a visual alarm and an auditory alarm.

13. A computer program product of claim 12, further comprising program code to:
configure a second socket to receive a second plug having a second power end and a second ground end, the second socket disposed at the base; and
configure a second detecting unit in communication with the second socket, the second detecting unit disposed at the base, the second detecting unit comprising:
a third switch and a fourth switch, the third switch configured to detect receipt of the second power end by the second socket and the second switch configured to detect receipt of the second ground end by the second socket; and
a second AND gate having a first input in communication with the third switch and a second input in communication with the fourth switch;
detecting, utilizing the second AND gate, receipt of the second plug by the second socket;
output the voltage signal responsive to the detection including output the first voltage signal responsive to detection of one of receipt of both the second power end and the second ground end and receipt of the second ground end and absence of the second power end, and output the second voltage signal responsive to receipt of the second power end and absence of the second ground end;
configure an OR gate in communication with the first output end of the first AND gate and a second output end of the second AND gate; and
output the second voltage signal from the OR gate to the management unit responsive to receipt of the second voltage signal from at least one of the first AND gate and the second AND gate.

14. A method comprising:
configuring a first socket to receive a first plug having a first power end and a first ground end, the first socket disposed at a base; and
configuring a first detecting unit in communication with the first socket, the first detecting unit disposed at the base, the first detecting unit comprising:
- a first switch and a second switch, the first switch configured to detect receipt of the first power end by the first socket and the second switch configured to detect receipt of the first ground end by the first socket; and
- a first AND gate having a first input in communication with the first switch and a second input in communication with the second switch;

detecting, utilizing the first AND gate, communication between the first plug and the first socket; and
outputting a voltage signal responsive to the detecting including outputting a first voltage signal responsive to detection of one of receipt of both the first power end and the first ground end and receipt of the first ground end and absence of the first power end, and outputting a second voltage signal responsive to receipt of the first power end and absence of the first ground end.

15. The method of claim 14, further comprising:
configuring a management unit in electrical communication with a first output end of the first AND gate; and
performing a predetermined operation responsive to receipt of the second voltage signal by the management unit.

16. The method of claim 15, wherein the predetermined operation is selected from the group consisting of: a visual alarm and an auditory alarm.

17. The method of claim 16, further comprising:
configuring a second socket to receive a second plug having a second power end and a second ground end, the second socket disposed at the base; and
configuring a second detecting unit in communication with the first socket, the second detecting unit disposed at the base, the second detecting unit comprising:
- a third switch and a fourth switch, the third switch configured to detect receipt of the second power end by the second socket and the second switch configured to detect receipt of the second ground end by the second socket; and
- a second AND gate having a first input in communication with the third switch and a second input in communication with the fourth switch;

detecting, utilizing the second AND gate, communication between the second plug and the second socket;
outputting a voltage signal responsive to the detecting including outputting the first voltage signal responsive to detection of one of receipt of both the second power end and the second ground end and receipt of the second ground end and absence of the second power end, and outputting a second voltage signal responsive to receipt of the second power end and absence of the second ground end;
configuring an OR gate in communication with the first output end of the first AND gate and a second output end of the second AND gate; and
outputting the second voltage signal from the OR gate to the management unit responsive to receipt of the second voltage signal from at least one of the first AND gate and the second AND gate.

* * * * *